(12) United States Patent
Noorbakhsh et al.

(10) Patent No.: US 6,432,259 B1
(45) Date of Patent: Aug. 13, 2002

(54) PLASMA REACTOR COOLED CEILING WITH AN ARRAY OF THERMALLY ISOLATED PLASMA HEATED MINI-GAS DISTRIBUTION PLATES

(75) Inventors: Hamid Noorbakhsh, Fremont; Michael Welch, Livermore; Siamak Salimian, Sunnyvale; Paul Luscher, Sunnyvale; Hongching Shan, San Jose; Kaushik Vaidya, Sunnyvale; Jim Carducci, Sunnyvale; Evans Lee, Milpitas, all of CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/461,682

(22) Filed: Dec. 14, 1999

(51) Int. Cl.[7] .............................. H05H 1/00; C23C 16/00
(52) U.S. Cl. .............................. 156/345.33; 156/345.34; 156/345.44; 118/724; 118/723 E
(58) Field of Search ..................... 118/723 I, 723 E, 118/724, 715; 156/345.33, 345.34, 345.44

(56) References Cited

U.S. PATENT DOCUMENTS

| 5,423,936 A | | 6/1995 | Tomita et al. ............... 156/345 |
|---|---|---|---|
| 5,772,771 A | * | 6/1998 | Li et al. .................... 118/723 I |
| 5,906,683 A | * | 5/1999 | Chen et al. ................. 118/724 |
| 6,013,155 A | | 1/2000 | McMillin et al. |
| 6,036,877 A | | 3/2000 | Collins et al. ................. 216/68 |
| 6,054,013 A | * | 4/2000 | Collins et al. ............... 156/345 |
| 6,070,551 A | * | 6/2000 | Li et al. .................... 118/723 I |
| 6,143,078 A | * | 11/2000 | Ishikawa et al. ............. 118/715 |
| 6,158,384 A | * | 12/2000 | Ye et al. .................... 118/723 I |

FOREIGN PATENT DOCUMENTS

| EP | 838843 A2 | 4/1998 |
|---|---|---|
| EP | 877410 A1 | 11/1998 |
| EP | 838843 A3 | 1/1999 |
| WO | WO 98/560027 | 12/1998 |
| WO | WO 00/41212 | 7/2000 |

* cited by examiner

*Primary Examiner*—Gregory Mills
*Assistant Examiner*—P. Hassanzadeh
(74) *Attorney, Agent, or Firm*—Michaelson and Wallace; Joseph Bach; Ben Allan (57) ABSTRACT

A plasma reactor embodying the invention includes a wafer support and a chamber enclosure member having an interior surface generally facing the wafer support. At least one miniature gas distribution plate for introducing a process gas into the reactor is supported on the chamber enclosure member and has an outlet surface which is a fraction of the area of the interior surface of said wafer support. A coolant system maintains the chamber enclosure member at a low temperature, and the miniature gas distribution plate is at least partially thermally insulated from the chamber enclosure member so that it is maintained at a higher temperature by plasma heating.

101 Claims, 3 Drawing Sheets

PLASMA REACTOR COOLED CEILING WITH AN ARRAY OF THERMALLY ISOLATED PLASMA HEATED MINI-GAS DISTRIBUTION PLATES

BACKGROUND OF THE INVENTION

1. Technical Field

The invention is related to a plasma reactor for processing a semiconductor wafer using polymer precursor gases such as fluorocarbon gases, and in particular to a gas distribution plate and ceiling thereof.

2. Background Art

In plasma processing employed in the fabrication of semiconductor microelectronic integrated circuits, a semiconductor wafer is immersed in a plasma inside the chamber of a plasma reactor. The reactor may be thus employed to carry out any one of various processes on the wafer, such as chemical vapor deposition or reactive ion etching. In certain plasma etch processes carried out in such reactors, the upper most layer (the layer to be etched) may have a lower etch rate than the underlying layer (which must not be etched in most cases). This presents an especially challenging problem because there would be no etch selectivity (or an inverse selectivity) of the upper layer to the lower layer. This situation is characteristic of a plasma process for etching a dielectric layer overlying another layer such as a semiconductor layer (e.g., a silicon dioxide layer overlying a polysilicon layer) using a process gas containing an etchant such as fluorine or fluoride compounds. The problem has been solved by using a fluoride compound such as a fluorocarbon gas or a fluoro-hydrocarbon gas which, upon ionization, tends to break up into fluorine-containing etchant species and polymer precursor species. The polymer precursor species provide the requisite etch selectivity because it tends to accumulate as a hard polymer film on non-oxygen containing materials (such as the underlying polysilicon layer) but does not accumulate on oxygen-containing materials (such as the overlying silicon dioxide layer). Thus, the underlying layer is protected from the etchant by the polymer layer while the overlying layer is left exposed to the etchant, so that the process has a net etch selectivity of the overlying layer.

The problem is that the polymer accumulates on the interior reactor surfaces, including the ceiling of the chamber. Typically, the ceiling consists of a gas distribution plate with gas distribution inlets or orifices through which the process gas must be sprayed into the reactor chamber for uniform distribution. The plate must be formed of materials such as quartz which are suitable for carrying the etchant-containing process gases. Such materials do not readily lend themselves to temperature control, and therefore the center of the gas distribution plate tends to be very hot due to plasma heating while the perimeter tends to be colder. The polymer accumulates as a solid film in the colder perimeter region and cannot accumulate in the hot center region. Between these two regions is a transition region where the polymer tends to accumulate as a fine powder, which tends to flake onto the wafer and create contamination. This requires that the gas distribution plate be replaced periodically. The gas distribution plate is on the order of the diameter of the wafer (e.g., 9 inches or 14 inches) and its replacement is expensive due to the cost of the item as well as the non-productive time during which the reactor is disassembled for removal and replacement of the gas distribution plate. However, periodic removal and replacement of the gas distribution plate is not a solution to the problem, as flaking of any accumulated polymer from the gas distribution plate can occur any time up to the replacement of the plate.

One solution to this problem might be to cool the entire gas distribution plate so that the polymer deposited thereon is entirely of a hard consistency and will not flake. However, this would eventually block the gas inlets, stopping the inflow of the process gas. Another solution might be to heat the entire gas distribution plate sufficiently to prevent any polymer from accumulating thereon. However, this would expose the entire gas distribution plate to bombardment from the plasma and much faster wear.

Therefore, there is a need for a gas distribution plate which is not susceptible to accumulation of polymer or the flaking of accumulated polymer onto the wafer.

SUMMARY OF THE INVENTION

A plasma reactor embodying the invention includes a wafer support and a chamber enclosure member having an interior surface generally facing the wafer support. At least one miniature gas distribution plate for introducing a process gas into the reactor is supported on the chamber enclosure member and has an outlet surface which is a fraction of the area of the interior surface of said wafer support. A coolant system maintains the chamber enclosure member at a low temperature, and the miniature gas distribution plate is at least partially thermally insulated from the chamber enclosure member so that it is maintained at a higher temperature by plasma heating.

DETAILED DESCRIPTION OF THE PREFERRED EMBODIMENTS

A reactor embodying the present invention has a cooled ceiling formed preferably of a good thermal conductor such as metal and an array of mini-gas distribution plates embedded therein, the gas distribution plates being thermally isolated from the cooled ceiling. The ceiling is sufficiently cooled so that polymer accumulates thereon as a solid film with little or no tendency to flake off, while the mini-gas distribution plates reach a sufficiently high temperature from plasma-heating so that no polymer accumulates thereon. Thus, neither the ceiling nor the array of mini-gas distribution plates harbors polymer having a tendency to flake. As a result, the necessity for replacement of internal chamber parts (such as the ceiling or the mini-gas distribution plates) is greatly reduced if not eliminated.

Each mini-gas distribution plate has plural gas injection holes connected to a common manifold within the plate. The area of each of the mini-gas distribution plates facing the plasma is limited so that: (1) the area is contained within a region in which the turbulence from the injected gas in the vicinity of the inlets prevents or impedes polymer accumulation, and (2) the size or thermal mass of the mini-gas distribution plate is sufficiently low to allow rapid plasma-heating of the plate. In order to enhance the gas turbulence across the area of the plate, the gas injection holes in each mini-gas distribution plate are angled relative to the surface of the plate facing the chamber interior. Preferably, the gas injection holes are angled so that the gas injection streams from adjacent holes cross one another or together form a vortex pattern. In a preferred embodiment, the mini-gas distribution plates extend slightly out from the surface of the ceiling, to enhance plasma-heating thereof and to enhance gas injection turbulence. Preferably, the mini-gas distribution plates are each a relatively small fraction of the area of the entire ceiling.

Figure 1:
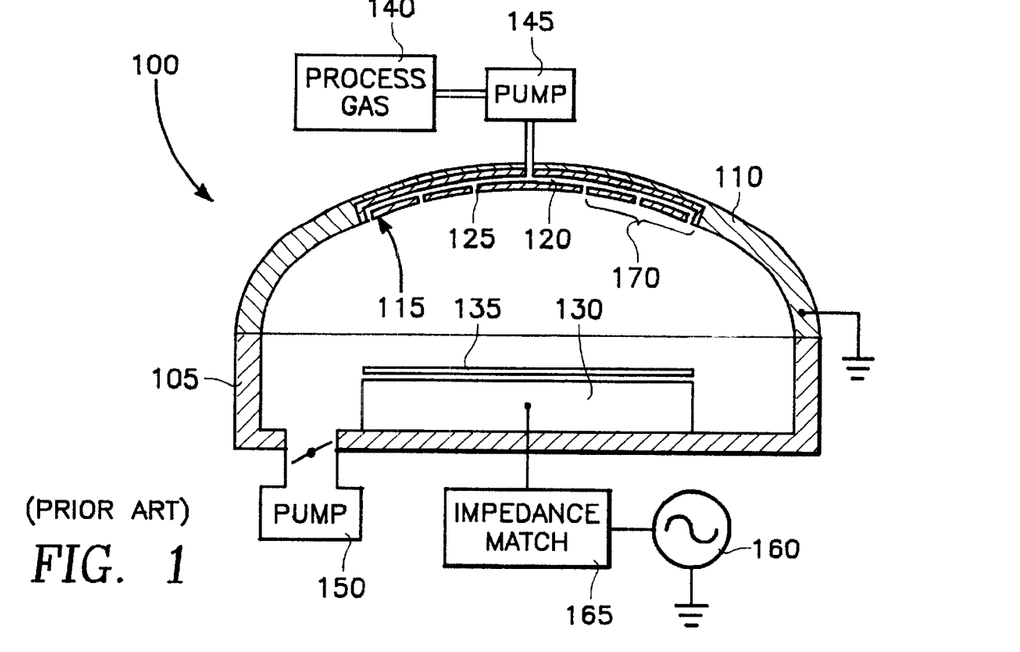
FIG. 1 illustrates a conventional plasma reactor including a gas distribution plate of the prior art.

FIG. 1 illustrates a conventional plasma reactor chamber 100 having a cylindrical side wall 105 supporting a ceiling 110 consisting of a large gas distribution plate 115. The gas distribution plate 115 covers a major portion of the ceiling 110. The gas distribution plate has a gas manifold 120 from which plural gas inlets 125 extend downwardly to the reactor chamber interior. The gas distribution plate 115 overlies a wafer support 130 on which a semiconductor wafer 135 is mounted. The gas distribution plate 115 has a diameter generally corresponding to that of the wafer 135, and may be on the order of 9 inches or 14 inches in diameter. Process gas is supplied to the gas distribution plate manifold by a process gas source 140 through a pump 145. The pressure within the chamber is maintained at a desired vacuum level by a vacuum pump 150. For capacitive coupling of RF power to the plasma within the chamber 100, RF power is applied to the wafer support 130 by an RF generator 160 through an impedance match circuit 165. The ceiling 110 or the gas distribution plate 115 may include a conductive material which is grounded to provide a an RF return.

For a reactive ion etch process to be carried out on a dielectric layer, the gas source can provide a fluorohydrocarbon gas, in which case a polymer layer forms on a major portion of the gas distribution plate 115. Heating from the plasma generally keeps the center portion of the gas distribution plate too hot to accumulate any polymer, while the peripheral edge portion of the gas distribution plate is sufficiently cool to permit a hard film of polymer to accumulate thereon. An intermediate annular portion 170 of the gas distribution plate 115 is typically at an intermediate temperature at which the polymer can accumulate on the surface but cannot form a hard film. Instead, in the intermediate region 170 the polymer tends to be powdery and flakes easily, leading to contamination of the wafer 135. Therefore, the gas distribution plate 115 must be replaced frequently.

Figure 2:
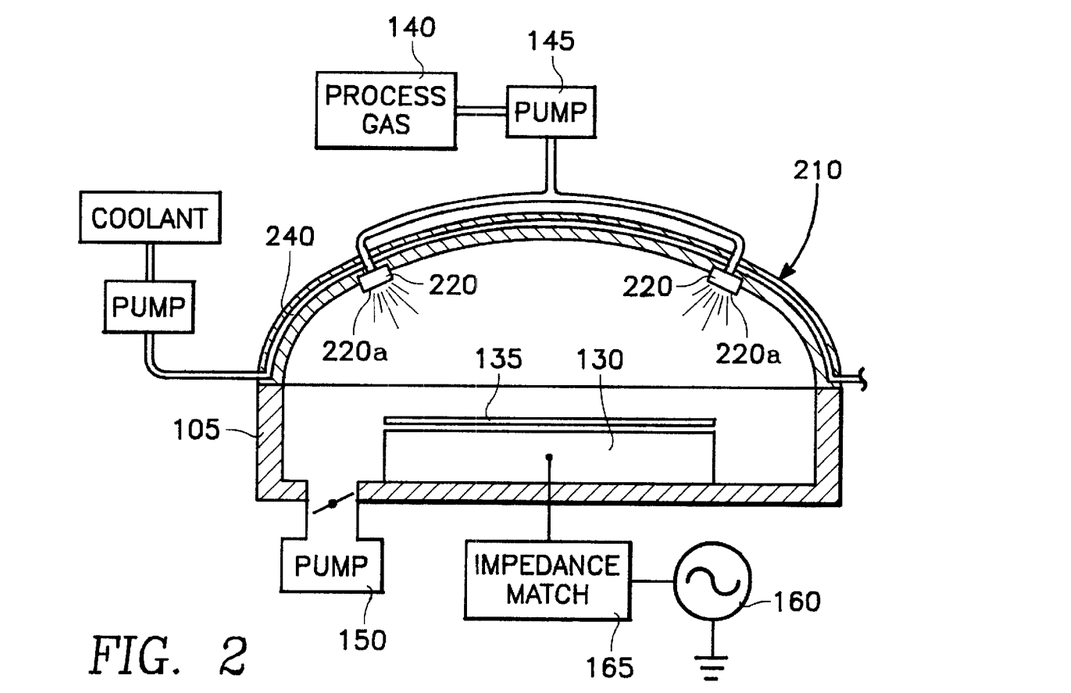
FIG. 2 is a cross-sectional cut-away view of a plasma reactor including a water-cooled ceiling and an array of thermally isolated mini-gas distribution plates embodying the invention.
Figure 3:
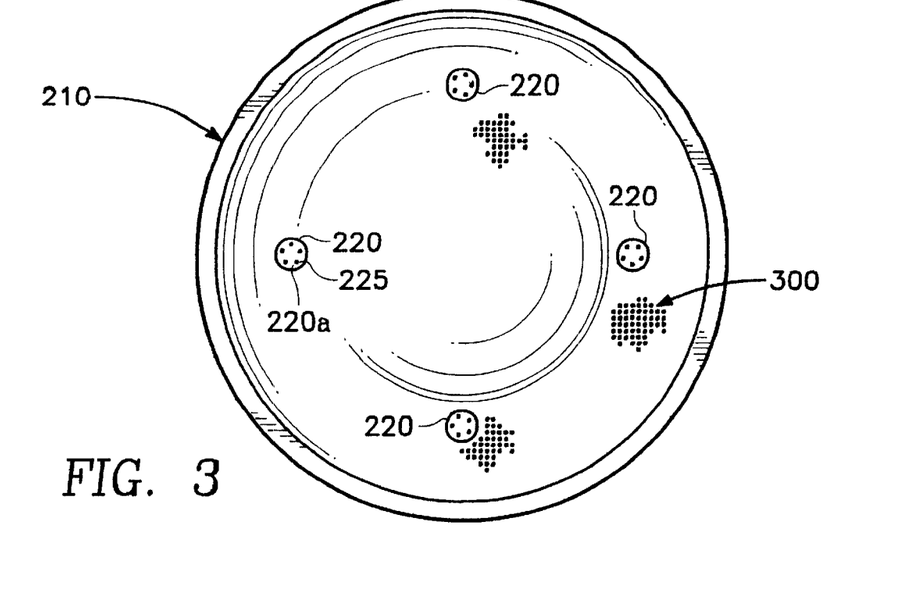
FIG. 3 is a plan view of the ceiling interior surface corresponding to FIG. 2.

The foregoing problems are overcome in the present invention. Referring to FIGS. 2 and 3, a plasma reactor embodying the present invention has a water-cooled ceiling 210 in which there are embedded an array of showerhead plugs or mini-gas distribution plates 220. Each mini-gas distribution plate 220 is formed of a semi-metal such as silicon or a dielectric such as silicon dioxide (quartz) or sapphire, and has plural gas inlets 225 through which process gas is sprayed into the reactor chamber interior. Preferably, the mini-gas distribution plates 220 are thermally insulated from the water-cooled ceiling 210, so that they are readily heated by the plasma within the chamber. Each gas distribution plate 220 is sufficiently small relative to the ceiling—has a sufficiently small thermal mass—so as to be rapidly heated by the plasma upon plasma ignition. (For example, the ceiling 210 may have a diameter in a range of 9 inches to 14 inches, while the gas distribution plate has an exposed diameter on the order of about 0.25–0.5 inch. As a result, the plasma heats each mini-gas distribution plate 220 to a sufficiently high temperature to prevent any accumulation of polymer thereon. The advantage is that the gas inlets 225 of each mini-gas distribution plate 220 can be kept clear of polymer.

Preferably, the diameter of each mini-gas distribution plate 220 is sufficiently small so that the entire bottom surface 220a of the gas distribution plate 220 is enveloped within a region of gas flow turbulence of the process gas spray from the inlets 225. Thus, for example, each mini-gas distribution plate 220 has an exposed diameter on the order of about 0.25–0.5 inch. This region has sufficient gas turbulence to retard or prevent the accumulation of polymer on the surface 220a.

Figure 4:
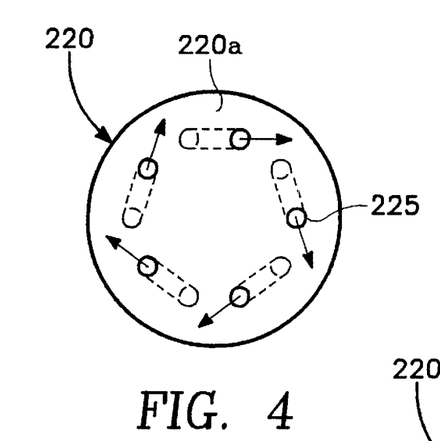
FIG. 4 is a plan view of an individual mini-gas distribution plate of the invention having angled gas inlets providing a preferred vortex pattern of gas spray.
Figure 5:
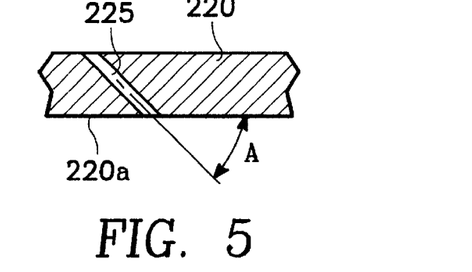
FIG. 5 is a cross-sectional cut-away view corresponding to FIG. 4.
Figure 6:
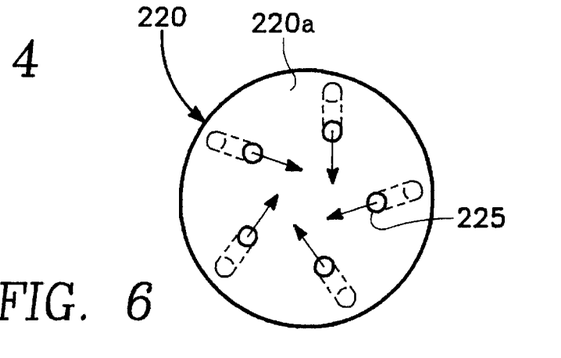
FIG. 6 illustrates an alternative spray pattern corresponding to FIG. 4.

Referring to FIGS. 4 and 5, the gas turbulence around the bottom surface 220a is enhanced by introducing a crossing pattern of gas spray paths from the plural gas inlets 225 of the mini-gas distribution plate 220. The embodiment of FIGS. 4 and 5 provides a vortex pattern (indicated by the arrows of FIG. 4). This is accomplished by drilling each of the gas inlets 225 at an angle A relative to the outlet surface 220a of the mini-gas distribution plate 220. Preferably, the angle A is in the range of about 20 degrees to 30 degrees. In an alternative embodiment illustrated in FIG. 6, the gas spray paths of the plural gas inlets 225 are directed at other inlets in order to enhance the gas turbulence.

Figure 7:
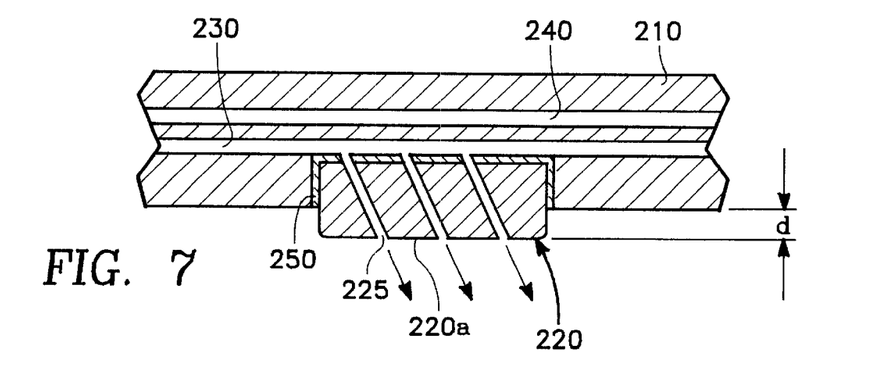
FIG. 7 is an enlarged cut-away cross-sectional view corresponding to FIG. 2.

As a further aid in inhibiting the accumulation of polymer on the mini-gas distribution plates 220, the outlet surface 220a of the plate 220 extends slightly below the surface of the ceiling 210 by a distance d, as shown in FIG. 7. The distance d is preferably about 0.02 inch to 0.03 inch or a fraction of the thickness of the gas distribution plate 220. The enlarged cross-sectional view of FIG. 7 illustrates one preferred implementation in which the gas inlets 225 are angled holes passing entirely through the mini-gas distribution plate 220. Process gas is supplied to the gas inlets 225 by a common manifold 230 formed in the ceiling 210. A water jacket 240 of the water-cooled ceiling 210 is also shown in the drawing of FIG. 7. Preferably, a thermal insulation layer 250, which may be aluminum nitride for example, is trapped between the mini-gas distribution plate 220 and the ceiling 210.

The water-cooled ceiling 210 is maintained at a sufficiently low temperature so that polymer accumulates on the entire ceiling as a very hard film which is virtually immune from flaking or contributing contamination to the chamber interior. The thermally isolated mini-gas distribution plates 220 are heated by the plasma to a sufficiently high temperature to inhibit accumulation of polymer thereon. Thus, the gas inlets 225 are kept clear of any polymer. The small size of the mini-gas distribution plates 220 not only enables the plasma to heat them to the requisite temperature. It also permits the concentration of gas inlets 225 over the small surface 220a to provide sufficient gas turbulence to further inhibit the accumulation of polymer on the surface 220a or inlets 225. The gas turbulence is enhanced by providing a crossed or vortex pattern of gas spray paths from each of the gas inlets 225 of the mini-gas distribution plate 220, and having the outlet surface 220a below the ceiling 210. The combination of all of the foregoing features prevents any observable accumulation of polymer on any portion the mini-gas distribution plate 220.

In a preferred embodiment, there are four mini-gas distribution plates 220 mounted on the ceiling 210 at four symmetrically spaced locations overlying the periphery of the wafer 135. of course, additional mini-gas distribution plates may be provided in other embodiments, or their placement modified from the arrangement illustrated in FIG. 5.

The advantage is that the ceiling and the gas distribution plate need not be periodically replaced, at least not as frequently as in the prior art, a significant advantage. Moreover, the system is more immune from contamination from polymer flaking regardless of the frequency with which the ceiling and gas distribution plates are replaced.

Figure 8:
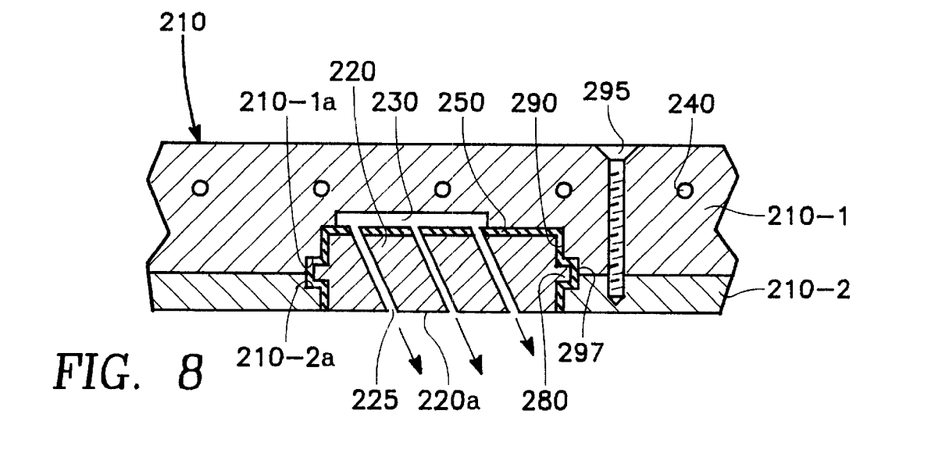
FIG. 8 is an view corresponding to FIG. 7 illustrating a method of fastening the mini-gas distribution plate on the ceiling.

FIG. 8 illustrates one mode for mechanically holding the mini-gas distribution plate 220 in place on the ceiling 210. The mini-plate 220 has an annular ear 280 extending radially from its periphery. The ceiling 210 has a hole 290 in which the mini-plate 220 is nested, the ceiling 210 having upper and lower sections 210-1, 210-2 joined together by a threaded fastener 295. Each section 210-1, 210-2 has an annular shelf 210-1a, 210-2a which together form an annular pocket 297 for receiving and holding the annular ear 280.

In a preferred embodiment, polymer flaking from the ceiling 210 is inhibited not only by cooling the ceiling but, in addition, by providing a "waffled" surface on the ceiling. The waffled surface, partially illustrated in FIG. 3, consists of an array of 1 mm half-spherical "bumps" 300 spaced apart by about 4 mm. The bumps 300 are arrayed in this manner across the entire interior surface of the ceiling 210. They tend to force the solid polymer film accumulated thereon to form local crystalline regions which are less susceptible to cracking than a large crystalline region.

Figure 9:
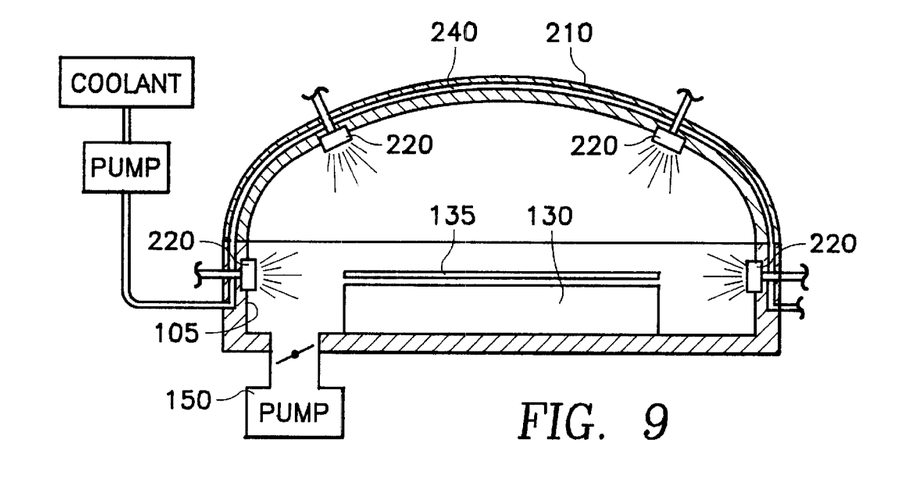
FIG. 9 illustrates an alternative embodiment of the invention having a mini-gas distribution plate mounted on the side wall of the reactor chamber.

While the invention has been described with reference to a preferred embodiment in which the mini-gas distribution plates are mounted in the reactor chamber ceiling, in an alternative embodiment mini-gas distribution plates may be mounted at other locations within the chamber, such as the chamber side wall, as illustrated in FIG. 9. In this alternative embodiment, the side wall 105 preferably is water-cooled for the same reasons that the ceiling 210 is water cooled as explained above. The mini-gas distribution plates 220 on the side wall 105 may be provided in addition to or in lieu of the gas distribution plates 220 on the ceiling 210.

While the invention has been described in detail by specific reference to preferred embodiments, it is understood that variations and modifications may be made without departing from the true spirit and scope of the invention.

What is claimed is:

1. A plasma reactor for processing a semiconductor wafer, comprising:
   a plasma source power applicator;
   a wafer support;
   a chamber enclosure member having an interior surface generally facing said wafer support;
   at least one miniature gas distribution plate for introducing a process gas into said reactor and supported on said chamber enclosure member and having an outlet surface which is a fraction of the area of said wafer support;
   said chamber enclosure member comprising coolant passages for maintaining said chamber enclosure member at a low temperature;
   a thermally resistant element between said miniature gas distribution plate and said chamber enclosure member; and
   wherein said at least one miniature gas distribution plate confronts said chamber enclosure member along an interface, said thermally resistant element being interposed substantially along said interface.

2. The reactor of claim 1 wherein said thermally resistant element has a sufficiently low heat conductance so that plasma heating can maintain said miniature gas distribution plate at a sufficiently high temperature to prevent accumulation of polymer.

3. The reactor of claim 1 wherein said cooling passages are sufficient to maintain said chamber enclosure at a temperature to inhibit flaking of accumulated polymer therefrom.

4. The apparatus of claim 1 wherein said gas distribution plate is of a sufficiently small size so that plasma heating thereof is capable of maintaining said gas distribution plate at a sufficiently high temperature to prevent accumulation of polymer thereon.

5. The apparatus of claim 1 wherein said miniature gas distribution plate comprises plural gas inlet holes having respective openings at said outlet surface.

6. The apparatus of claim 5 wherein said plural gas inlet holes extend through said miniature gas distribution plate, said chamber enclosure member comprising a process gas supply manifold in communication with said plural gas inlet holes.

7. The apparatus of claim 5 wherein said gas inlet holes are elongate and extend angularly with respect to a perpendicular direction to said outlet surface.

8. The apparatus of claim 7 wherein said inlet holes are angled relative to said outlet surface so as to provide respective spray patterns from said respective inlet holes which have a crossing pattern.

9. The apparatus of claim 8 wherein said outlet surface has a sufficiently small surface area so as to be contained within said gas turbulent region.

10. The apparatus of claim 7 wherein said inlet holes are angled relative to said outlet surface so as to provide respective spray patterns from said respective inlet holes which have a vortex pattern.

11. The apparatus of claim 7 wherein said inlet holes provide spray patterns which enhance gas turbulence in a gas turbulent region proximal said outlet surface.

12. The apparatus of claim 1 further a coolant source for circulating coolant within said passages.

13. The apparatus of claim 1 further comprising an array of miniature gas distribution plates on said chamber enclosure member.

14. The apparatus of claim 13 wherein said chamber enclosure member comprises a ceiling overlying said wafer support, said ceiling having a surface area exceeding the surface area of said wafer support, the outlet surface of each of said miniature gas distribution plates being of an area at least about one order of magnitude less than the surface area of said ceiling.

15. The apparatus of claim 14 further comprising plural holes in the interior surface of said ceiling within which respective ones of said miniature gas distribution plates are nested.

16. The apparatus of claim 15 wherein each of said miniature gas distribution plates protrudes from the respective hole so that the outlet surface of each of the gas distribution plates protrudes below the interior surface of said ceiling by a distance d.

17. The apparatus of claim 16 wherein the interior surface of said ceiling is waffled to provide better adhesion thereto of polymer accumulated thereon.

18. The apparatus of claim 16 wherein said distance d is on the order of a millimeter.

19. The apparatus of claim 18 wherein the diameter of each of said miniature gas distribution plates is on the order of less than 1 cm, while the diameter of said ceiling is on the order of about 25 cm.

20. The apparatus of claim 1 wherein the thermal mass of said miniature gas distribution plate is sufficiently small and the thermal insulation thereof is sufficiently great so that the plasma heating thereof maintains said miniature gas distribution plate above a polymer condensation temperature, while said cooling system is sufficient to maintain said ceiling below a polymer condensation temperature.

21. The apparatus of claim 1 wherein said outlet surface is generally facing a central processing region of said reactor.

22. The apparatus of claim 1 wherein said outlet surface comprises one of: (1) a generally planar surface, or (2) a substantially U-shaped surface exposed to a processing chamber.

23. A plasma reactor comprising:
a chamber enclosure including a ceiling, said enclosure defining a chamber interior;
a wafer support within said chamber interior and underlying said ceiling;
a plasma source power applicator;
an array of plural miniature gas distribution plates on the interior side of said ceiling, each of said miniature gas distribution plates having an outlet surface facing said chamber interior with plural gas inlet holes for spraying respective streams of process gas into said chamber interior, said outlet surface having an area less than a fraction of the area of the interior of said ceiling; and
wherein said outlet surface is exposed to said chamber interior and generally facing a central region of said chamber interior such that the process gas is provided into the central region of the chamber interior.

24. The reactor of claim 22 further comprising:
a source of a deposition precursor-containing process gas coupled to each of said miniature gas distribution plates, said process gas being a precursor of a deposition material having a condensation temperature;
wherein said miniature gas distribution plates are susceptible of being heated to a temperature above said condensation temperature by a plasma within chamber interior while permitting said ceiling to remain at a temperature below said condensation temperature.

25. The reactor of claim 24 further comprising waffling on the interior surface of said ceiling, said waffling being sufficient to promote adhesion of said deposition material on the ceiling interior surface.

26. The reactor of claim 25 wherein said waffling comprises plural bumps on said interior ceiling surface, said bumps having a typical height on the order of about 1 mm at a bump-to-bump spacing on the order of about 4 mm.

27. The reactor of claim 23 wherein said gas inlet holes are angled relative to said outlet surface so as to enhance gas turbulence produced by said respective streams of process gas in the vicinity of said outlet surface.

28. The reactor of claim 27 wherein said gas inlet holes are angled so as to provide a crossing pattern of said respective streams.

29. The reactor of claim 27 wherein said gas inlet holes are angled so as to provide a vortex pattern of said respective streams.

30. The reactor of claim 23 further comprising a cooling system for cooling said ceiling.

31. The reactor of claim 30 wherein said cooling system is sufficient to maintain said ceiling below said condensation temperature.

32. The reactor of claim 31 wherein cooling system comprising coolant passages in said ceiling and a coolant source for supporting coolant flow through said coolant passages.

33. The reactor of claim 23 further comprising thermal insulation between each of said miniature gas distribution plates and said ceiling.

34. The reactor of claim 33 wherein said thermal insulation is sufficient to permit plasma heating of said miniature gas distribution plates above said condensation temperature while said ceiling is below said condensation temperature.

35. The reactor of claim 33 wherein said thermal insulation has a thermal resistance on the order of that of aluminum nitride.

36. The reactor of claim 33 wherein said thermally resistant element extends substantially along an interface between said chamber enclosure and each of said miniature gas distribution plates.

37. The reactor of claim 23 wherein said gas distribution plate is of a sufficiently small size so that it is susceptible of being heated above said condensation temperature by plasma heating.

38. The reactor of claim 23 wherein said gas distribution plate has a diameter of about 0.25 inch.

39. The reactor of claim 23 wherein said gas distribution plate protrudes beyond an interior surface of said chamber enclosure by a fraction of the thickness of said gas distribution plate.

40. The reactor of claim 39 wherein said fraction is on the order of about one-half.

41. The reactor of claim 23 wherein said outlet surface comprises one of: (1) a generally planar surface, or (2) a substantially U-shaped surface exposed to said chamber interior.

42. A showerhead plug for mounting on an interior side of a plasma reactor chamber enclosure member, said plug comprising:
plural gas inlet holes for spraying a process gas into said reactor at an outlet surface of said showerhead plug;
said showerhead plug being of a small fraction of the size of said chamber enclosure member; and
wherein said showerhead plug is adapted so that said outlet surface is capable of being positioned exposed to and generally facing a central region of said reactor chamber such that the process gas is provided into the central region of the chamber interior.

43. The plug of claim 42 further comprising:
a thermally insulating material for thermally insulating at least said outlet surface from said chamber enclosure member.

44. The plug of claim 43 wherein said thermally resistant element is capable of extending substantially along an interface between said chamber enclosure member and said showerhead plug.

45. The plug of claim 42 wherein said chamber enclosure member comprises a reactor chamber ceiling.

46. The plug of claim 42 wherein said plural gas inlet holes are angled relative to said outlet surface to enhance gas turbulence in the vicinity of said outlet surface.

47. The plug of claim 46 wherein said plural gas inlet holed provide a vortex spray pattern.

48. The plug of claim 46 wherein said plural gas inlet holes provide a crossing spray pattern.

49. The plug of claim 42 wherein said plug comprises a showerhead body and thermal insulation between said body said ceiling.

50. The reactor of claim 49 wherein said thermal insulation is sufficient to permit plasma heating of said showerhead plug above a condensation temperature of a deposition precursor material contained in a process gas while said ceiling is below said condensation temperature.

51. The reactor of claim 50 wherein said showerhead plug is of a sufficiently small size so that it is susceptible of being heated above said condensation temperature by plasma heating.

52. The reactor of claim 49 wherein said thermal insulation has a thermal resistance on the order of that of aluminum nitride.

53. The reactor of claim 42 herein said gas distribution plate has a diameter of about 0.25 inch.

54. The reactor of claim 42 wherein said showerhead plug protrudes beyond an interior surface of said chamber enclosure by a fraction of the thickness of said showerhead plug.

55. The reactor of claim 54 wherein said showerhead plug protrudes beyond an interior surface of said chamber by about 0.2 inches to 0.3 inches.

56. The plug of claim 42 wherein said outlet surface comprises one of: (1) a generally planar surface, or (2) a substantially U-shaped surface capable of being exposed to said plasma processing chamber interior.

57. A plasma reactor comprising:
a chamber enclosure including a ceiling, said enclosure defining a chamber interior;
a wafer support within said chamber interior and underlying said ceiling;
a plasma source power applicator;
an array of plural miniature gas distribution plates on the interior side of said ceiling, each of said miniature gas distribution plates having an outlet surface facing said chamber interior with plural gas inlet holes for spraying respective streams of process gas into said chamber interior, said outlet surface having an area less than a fraction of the area of the interior of said ceiling;
wherein said gas inlet holes are angled relative to said outlet surface so as to enhance gas turbulence produced by said respective streams of process gas in the vicinity of said outlet surface; and
wherein said gas inlet holes are angled so as to provide a crossing pattern of said respective streams.

58. A plasma reactor comprising:
a chamber enclosure including a ceiling, said enclosure defining a chamber interior;
a wafer support within said chamber interior and underlying said ceiling;
a plasma source power applicator;
an array of plural miniature gas distribution plates on the interior side of said ceiling, each of said miniature gas distribution plates having an outlet surface facing said chamber interior with plural gas inlet holes for spraying respective streams of process gas into said chamber interior, said outlet surface having an area less than a fraction of the area of the interior of said ceiling;
wherein said gas inlet holes are angled relative to said outlet surface so as to enhance gas turbulence produced by said respective streams of process gas in the vicinity of said outlet surface; and
wherein said gas inlet holes are angled so as to provide a vortex pattern of said respective streams.

59. A showerhead plug for mounting on an interior side of a plasma reactor chamber enclosure member, said plug comprising:
plural gas inlet holes for spraying a process gas into said reactor at an outlet surface of said showerhead plug;
said showerhead plug being of a small fraction of the size of said chamber enclosure member;
wherein said plural gas inlet holes are angled relative to said outlet surface to enhance gas turbulence in the vicinity of said outlet surface; and
wherein said plural gas inlet holes provide a vortex spray pattern.

60. A showerhead plug for mounting on an interior side of a plasma reactor chamber enclosure member, said plug comprising:
plural gas inlet holes for spraying a process gas into said reactor at an outlet surface of said showerhead plug;
said showerhead plug being of a small fraction of the size of said chamber enclosure member;
wherein said plural gas inlet holes are angled relative to said outlet surface to enhance gas turbulence in the vicinity of said outlet surface; and
wherein said plural gas inlet holes provide a crossing spray pattern.

61. A plasma reactor for processing a semiconductor wafer, the plasma reactor comprising:
a) a chamber enclosure member defining a processing chamber;
b) a plasma source power applicator capable of providing a plasma region within the processing chamber;
c) a wafer support within the processing chamber;
d) the chamber enclosure member being adapted to allow cooling of the enclosure member;
e) at least one showerhead plug embedded within the chamber enclosure member, the at least one showerhead plug comprising:
(1) an outlet surface confronting the plasma region, the outlet surface having an area less than a fraction of the area of the wafer support; and
(2) a plurality of gas distribution holes extending through the at least one showerhead plug to the outlet surface;
f) a thermally resistant element located substantially along an interface between the at least one showerhead plug and the chamber enclosure member; and
g) wherein the at least one showerhead plug and the thermally resistant element are configured so as to allow plasma heating of the showerhead plug to inhibit accumulation of deposits on the outlet surface while the enclosure member is cooled to promote accumulation of deposits on the enclosure member.

62. The plasma reactor of claim 61 wherein the plurality of gas distribution holes extend angularly with respect to a perpendicular direction to the outlet surface.

63. The plasma reactor of claim 62 wherein the plurality of gas distribution holes are angle relative to the outlet surface such that gas exiting from respective ones of the plurality of gas distribution holes is directed at others of the plurality of gas distribution holes.

64. The plasma reactor of claim 62 wherein the plurality of gas holes are angled relative to the outlet surface such that gas exiting from respective ones of the plurality of gas distribution holes is directed so as to be capable of generating a vortex.

65. The plasma reactor of claim 62 wherein the plurality of gas distribution holes are capable of providing spray patterns which enhance gas turbulence in a gas turbulent region proximal the outlet surface.

66. The plasma reactor of claim 65 wherein the outlet surface has a sufficiently small surface area so as to be contained within the gas turbulent region.

67. The plasma reactor of claim 61 wherein the chamber enclosure member comprises a process gas supply manifold in communication with the plurality of gas distribution holes.

68. The plasma reactor of claim 61 wherein the outlet surface is a generally planar surface.

69. The plasma reactor of claim 61 wherein the outlet surface is a substantially U-shaped surface.

70. The plasma reactor of claim 61 wherein the outlet surface is flush with an interior surface of the enclosure member.

71. The plasma reactor of claim 61 wherein the outlet surface protrudes below an interior surface of the enclosure member.

72. The plasma reactor of claim 71 wherein the outlet surface is generally facing a central portion of the processing chamber.

73. The plasma reactor of claim 71 wherein the outlet surface is generally facing a central portion of the processing chamber.

74. The plasma reactor of claim 61 wherein the thermally resistant element extends substantially along an interface between opposing surfaces of the chamber enclosure member and each of said miniature gas distribution plates.

75. The plasma reactor of claim 61 wherein the outlet surface is generally facing a central portion of the processing chamber.

76. A plasma reactor for processing a semiconductor wafer, the plasma reactor comprising:
  a) a chamber enclosure member defining a processing chamber;
  b) a plasma source power applicator capable of providing a plasma region within the processing chamber;
  c) a wafer support within the processing chamber;
  d) the chamber enclosure member being adapted to allow cooling of the enclosure member;
  e) at least one showerhead plug embedded within the chamber enclosure member, the at least one showerhead plug comprising:
    (1) an outlet surface confronting the plasma region;
    (2) a plurality of gas distribution holes extending through the at least one showerhead plug to the outlet surface;
    (3) wherein the outlet surface is limited in area so that the area is contained within a region in which turbulence from injected gas from the plurality of gas distribution holes inhibits accumulation of deposits thereon; and
    (4) wherein the area of outlet surface is a fraction of the area of the wafer support;
  f) a thermally resistant element located substantially along an interface between the at least one showerhead plug and the chamber enclosure member; and
  g) wherein the at least one showerhead plug and the thermally resistant element are configured so as to allow plasma heating of the showerhead plug to inhibit accumulation of deposits on the outlet surface while the enclosure member is cooled to promote accumulation of deposits on the enclosure member.

77. The plasma reactor of claim 76 wherein the plurality of gas distribution holes extend angularly with respect to a perpendicular direction to the outlet surface.

78. The plasma reactor of claim 77 wherein the plurality of gas distribution holes are angled relative to the outlet surface such that gas exiting from respective ones of the plurality of gas distribution holes is directed at others of the plurality of gas distribution holes.

79. The plasma reactor of claim 76 wherein the plurality of gas distribution holes are angled relative to the outlet surface such that gas exiting from respective ones of the plurality of gas distribution holes is directed so as to be capable of generating a vortex.

80. The plasma reactor of claim 76 wherein the chamber enclosure member comprises a process gas supply manifold in communication with the plurality of gas distribution holes.

81. The plasma reactor of claim 76 wherein the outlet surface is a generally planar surface.

82. The plasma reactor of claim 76 wherein the outlet surface is a substantially U-shaped surface.

83. The plasma reactor of claim 76 wherein the outlet surface is flush with an interior surface of the enclosure member.

84. The plasma reactor of claim 76 wherein the outlet surface protrudes below an interior surface of the enclosure member.

85. The plasma reactor of claim 84 wherein the outlet surface is positioned generally facing a central region of the processing chamber.

86. The plasma reactor of claim 85 wherein each of the plurality of miniature gas distribution plugs confronts the chamber enclosure member along an interface, said thermally resistant element being interposed substantially along said interface.

87. The plasma reactor of claim 76 wherein each of the plurality of miniature gas distribution plugs confronts the chamber enclosure member along an interface, said thermally resistant element being interposed substantially along said interface.

88. The plasma reactor of claim 76 wherein the outlet surface is generally facing a central region of the processing chamber.

89. A plasma reactor comprising:
  a) a chamber enclosure member defining a processing chamber;
  b) a plasma source power applicator capable of providing a plasma region within the processing chamber;
  c) a wafer support within the processing chamber;
  d) the chamber enclosure member being adapted to allow cooling of the enclosure member;
  e) an array of plural miniature gas distribution plates embedded within the chamber enclosure member, each of the miniature gas distribution plates comprising:
    (1) an outlet surface confronting the chamber interior, the outlet surface having an area less than a fraction of the area of the chamber enclosure member; and
    (2) a plurality of holes extending through each of the miniature gas distribution plugs to the outlet surface;
  f) a thermally resistant element between each of the miniature gas distribution plugs and the chamber enclosure member; and g) wherein the miniature gas distribution plugs and the thermally resistant elements are configured such that the thermally resistant element is located substantially along an interface between the chamber enclosure and the miniature gas distribution plugs so as to allow plasma heating of the miniature gas distribution plugs to inhibit accumulation of deposits on the outlet surface while the enclosure member is cooled to promote accumulation of deposits on the enclosure member.

90. The plasma reactor of claim 89 wherein the plurality of holes extend angularly with respect to a perpendicular direction to the outlet surface.

91. The plasma reactor of claim 90 wherein the plurality of holes are at least one of: (a) angled relative to the outlet surface such that gas exiting from respective ones of the plurality of holes is directed at others of the plurality of holes, or (b) angled relative to the outlet surface such that gas exiting from respective ones of the plurality of holes is directed so as to be capable of generating a vortex.

92. The plasma reactor of claim 90 wherein the plurality of holes are capable of providing spray patterns which enhance gas turbulence in a gas turbulent region proximal the outlet surface, and wherein the outlet surface has a sufficiently small surface area so as to be contained within the gas turbulent region.

93. The plasma reactor of claim 89 wherein the chamber enclosure member comprises a process gas supply manifold in communication with the plurality of holes.

94. The plasma reactor of claim 89 wherein the outlet surface is a generally planar surface.

95. The plasma reactor of claim 89 herein the outlet surface is a substantially U-shaped surface.

96. The plasma reactor of claim 89 wherein the outlet surface is flush with an interior surface of the enclosure member.

97. The plasma reactor of claim 89 wherein the outlet surface protrudes below an interior surface of the enclosure member.

98. The plasma reactor of claim 97 wherein the outlet surface is generally facing a central region of the processing chamber.

99. The plasma reactor of claim 98 wherein each of the miniature gas distribution plugs confronts the chamber enclosure member along an interface, said thermally resistant element being interposed substantially along said interface.

100. The plasma reactor of claim 89 wherein each of the plurality of miniature gas distribution plugs confronts the chamber enclosure member along an interface, said thermally resistant element being interposed substantially along said interface.

101. The plasma reactor of claim 89 wherein the outlet surface is generally facing a central region of the processing chamber.

* * * * *